(12) United States Patent
Lehr

(10) Patent No.: US 7,829,889 B2
(45) Date of Patent: Nov. 9, 2010

(54) METHOD AND SEMICONDUCTOR STRUCTURE FOR MONITORING ETCH CHARACTERISTICS DURING FABRICATION OF VIAS OF INTERCONNECT STRUCTURES

(75) Inventor: Matthias Lehr, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 489 days.

(21) Appl. No.: 11/875,535

(22) Filed: Oct. 19, 2007

(65) Prior Publication Data

US 2008/0237588 A1 Oct. 2, 2008

(30) Foreign Application Priority Data

Mar. 30, 2007 (DE) ................. 10 2007 015 506

(51) Int. Cl.
*H01L 23/58* (2006.01)
(52) U.S. Cl. .................. 257/48; 438/14; 438/18
(58) Field of Classification Search .............. 257/48, 257/E21.529; 438/14, 18
See application file for complete search history.

(56) References Cited

U.S. PATENT DOCUMENTS 7,176,485 B2 * 2/2007 Leidy ..................... 257/48
7,705,352 B2 * 4/2010 Feustel et al. ............ 257/48

FOREIGN PATENT DOCUMENTS

GB   EP 0 273 251 A1   12/1987
JP    2001102405 A      4/2001

OTHER PUBLICATIONS

Transmittal letter from foreign associate dated Jan. 15, 2008.
Translation of Official Communication Issued: Nov. 9, 2007.

* cited by examiner

*Primary Examiner*—Cuong Q Nguyen
(74) *Attorney, Agent, or Firm*—Williams, Morgan & Amerson

(57) ABSTRACT

By forming a trench-like test opening above a respective test metal region during the etch process for forming via openings in a dielectric layer stack of sophisticated metallization structures of semiconductor devices, the difference in etch rate in the respective openings may be used for generating a corresponding variation of electrical characteristics of the test metal region. Consequently, by means of the electrical characteristics, respective variations of the etch process may be identified.

19 Claims, 5 Drawing Sheets

METHOD AND SEMICONDUCTOR STRUCTURE FOR MONITORING ETCH CHARACTERISTICS DURING FABRICATION OF VIAS OF INTERCONNECT STRUCTURES

BACKGROUND OF THE INVENTION

1. Field of the Invention

The subject matter of this disclosure generally relates to the fabrication of integrated circuits, and, more particularly, to a technique for forming inter-level conductive connections and for monitoring this process in semiconductor devices comprising one or more metallization layers.

2. Description of the Related Art

In an integrated circuit, a large number of circuit elements, such as transistors, capacitors and the like, are formed in or on an appropriate substrate, usually in a substantially planar configuration. Due to the large number of circuit elements and the required complex layout of many modern integrated circuits, generally the electrical connection of the individual circuit elements may not be established within the same level on which the circuit elements are manufactured, but such electrical connections may be established in one or more additional "wiring" layers, also referred to as metallization layers. These metallization layers generally include metal lines, providing the inner-level electrical connection, and also include a plurality of inter-level connections, also referred to as vias, wherein the metal lines and vias may also be commonly referred to as interconnections. In this specification, unless otherwise specified, a contact connecting to a circuit element or a portion thereof, for example, a gate electrode or a drain or source region of a transistor, may also be considered as an inter-level connection.

Due to the continuous shrinkage of the feature sizes of circuit elements in modern integrated circuits, the number of circuit elements for a given chip area, that is, the packing density, also increases. The increased packing density usually requires an even greater increase in the number of electrical interconnections to provide the desired circuit functionality. Therefore, the number of stacked metallization layers may increase as the number of circuit elements per chip area becomes larger. The fabrication of a plurality of metallization layers involves extremely challenging issues to be dealt with.

For example, copper and alloys thereof are metals generally used for sophisticated applications due to high conductivity and less electromigration effects compared to aluminum, which has been used over the last decades. In spite of these advantages, copper also exhibits a number of disadvantages regarding the processing and handling of copper in a semiconductor facility. For instance, copper may not be efficiently applied onto a substrate in larger amounts by well-established deposition methods, such as chemical vapor deposition (CVD), and copper also may not be effectively patterned by the usually employed anisotropic etch procedures. In manufacturing metallization layers including copper, the so-called damascene technique is therefore preferably used wherein a dielectric layer is first blanket-deposited and then patterned to define trenches and vias, which are subsequently filled with copper or copper alloys.

A further major drawback of copper is its tendency to readily diffuse in silicon dioxide and other low-k dielectrics. It is therefore usually necessary to employ a so-called barrier material in combination with a copper-based metallization to substantially reduce diffusion of copper into the surrounding dielectric material, as copper may readily migrate to sensitive semiconductor areas, thereby significantly changing the characteristics thereof. The barrier material provided between the copper and the dielectric material should, however, in addition to the required barrier characteristics, exhibit good adhesion to the dielectric material as well as to the copper and copper alloys and should also have as low an electrical resistance as possible so as to not unduly compromise the electrical properties of the interconnection as typically the barrier material's electric resistance is significantly greater than the electric resistance of copper and many of the copper alloys. In typical copper-based applications, tantalum and tantalum nitride, alone or in combination, as well as titanium and titanium nitride, alone or in combination, may be successfully employed as barrier layers. However, any other barrier layer schemes may be used as long as the required electrical, diffusion hindering and adhesion characteristics are obtained.

Irrespective of the material used for the barrier layer, with steadily decreasing features sizes, process engineers are increasingly confronted with the challenging task to form respective openings in the dielectric layer and deposit an extremely thin barrier layer within these openings having significantly high aspect ratios of approximately 5 or more for a trench width or a via diameter of about 0.2 µm and even less. The thickness of the barrier layer has to be chosen as thin as possible so as to not unduly consume "precious" space of the interconnection that should be filled with the more conductive copper, yet reliably suppress or prevent the diffusion of the copper into the neighboring dielectric. On the other hand, the etch process for forming the via openings is very critical as, on the one side, the opening has to reliably "land" on, i.e., connect to, the underlying metal or semiconductor region, if a contact opening is considered, while, on the other side, the "consumption" of metal or conductive material is to be maintained at a low level, when etching into the metal or conductive region, since even after re-filling the via or contact opening, the barrier material may increase the overall resistivity of the underlying metal. In particular, for highly scaled semiconductor devices, a high degree of uniformity of corresponding interconnect structures and contact vias is important, since any variation in resistance and thus current density may lead to fluctuations during operating the device and may even result in a premature failure of the device.

With reference to FIG. 1, the problems involved in forming a via to underlying metal regions and other conductive regions may be described in more detail. In FIG. 1, a semiconductor structure 100 comprises a substrate 101, which is to represent any appropriate substrate for the formation of microstructures including conductive and insulating areas, wherein at least some of the conductive areas are used for flowing a current through the semiconductor structure 100. For example, the substrate 101 may comprise a plurality of circuit elements of an integrated circuit, the electrical connection of which may require the formation of one or more "wiring" layers for providing the specified functionality of the integrated circuit. For convenience, any such circuit elements, such as transistors, capacitors and the like, are not shown. Formed above the substrate 101 is a conductive region 102, such as a contact region of a transistor, a capacitor and the like, so that the conductive region 102 may represent a highly doped semiconductor region, a semiconductor region including a metal silicide and the like. In other cases, the conductive region 102 may represent a metal line or any other metal region according to specific design criteria. For example, as previously pointed out, in highly scaled integrated circuits, copper or copper-based metals are frequently used for forming highly conductive metal regions. The conductive region 102 may be embedded in a dielectric material 104, which may be comprised of any appropriate material, such as silicon dioxide, silicon nitride, low-k dielectrics and the like.

A dielectric layer 103 comprised of any appropriate material or material composition, such as silicon dioxide, silicon nitride, low-k dielectric materials and the like, is formed above the metal region 102, wherein an etch stop layer 106 is provided between the metal region 102 and the dielectric layer 103. The etch stop layer 106 may be comprised of any appropriate material that exhibits high etch selectivity with respect to the material of the dielectric layer 103 so as to allow efficient control of an etch process through the dielectric layer 103. For example, silicon nitride, silicon carbide, nitrogen-enriched silicon carbide, silicon dioxide and the like may be appropriate materials for the etch stop layer 106. Moreover, a via opening 103A is formed in the layer 103 and may extend to a certain degree into the etch stop layer 106, wherein the via opening 103A is to be filled with a highly conductive material, such as metal and metal compounds and the like, in a later stage after completely etching through the etch stop layer 106. As previously explained, if a highly conductive material, such as copper or a copper alloy, may be used for filling the via opening 103A, in combination with a barrier material having a significantly lower conductivity, which may be present at the bottom of the respective via, the resulting electrical resistance of the conductive region 102, in combination with the resulting via, may depend on the degree of material consumption of the etch stop layer 106 caused by an etch process. Hence, the recess formed in the etch stop layer 106 at this manufacturing stage may significantly affect the overall performance of the resulting interconnect structure.

During the formation of the semiconductor device 100 as shown, after providing the layers 106 and 103 based on established techniques, respective lithography processes are performed to provide an appropriate etch mask. Thereafter, an anisotropic etch process is performed on the basis of a specified etch recipe, which depends on the material composition of the dielectric layer 103 and other device and process requirements. The anisotropic etch front has to be reliably stopped in the etch stop layer 106 to compensate for any across-substrate variations, for different intended etch depths, if required, or for substrate-to-substrate variations. On the other hand, a certain degree of material removal may be desirable to relax any constraints for the subsequent phase or step of the etch process for opening the etch stop layer 106 so as to not unduly remove material from the region 102. In a subsequent etch process, the etch stop layer 106 may be opened, wherein a reliable connection from the via opening 103A into the conductive region 102 is required. Depending on the uniformity of the previous etch process, the etch selectivity of the layer 106, the uniformity of the subsequent etch process for opening the layer 106 and other process non-uniformities, the amount of etching into the conductive region 102 may vary, thereby contributing to the non-uniformities of the electrical performance of the device 100.

Thus, it is important to monitor the etch rate during the respective etch process, since the performance of a respect etch tool may significantly vary, in particular at respective wet clean processes that may be performed on a regular basis during maintenance activities and the like. Therefore, in conventional monitoring of process strategies, the etch rate of the etch stop layer is determined by using SEM (scanning electron microscopy) and/or TEM (transmission electron microscopy) images of cross-sections obtained from dedicated test wafers having formed thereon a moderately thick etch stop layer 106. However, this procedure requires a great deal of effort in preparing appropriate samples. Moreover, it is a destructive measuring technique and thus provides only low statistics, which may therefore reduce the reliability of the measurement results. Moreover, the entire measurement procedure including the preparation of samples is very slow and thus may limit the ability to provide an efficient process control.

The present disclosure is directed to various methods and devices that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the subject matter disclosed herein relates to a process technique for forming via openings in a dielectric material on the basis of measurement data obtained on the basis of electric measurement techniques, thereby providing high statistical relevance while also reducing requirements with respect to sample preparation and metrology resources. Consequently, changes in process conditions, for instance caused by variations in respective etch chambers and the like, may be monitored with high statistical relevance and reduced delay, thereby enabling a fast and efficient response to the respective changes and process conditions. To this end, an appropriately prepared measurement site may be provided in which appropriate test openings may be formed on the basis of lateral dimensions that are greater compared to the respective lateral dimensions of via openings to obtain a difference in etch rate on the basis of the geometrical dependency of the local etch rate on the respective geometrical configuration of the respective openings. It has been recognized that the respective anisotropic etch recipes used for the formation of via openings in sophisticated metallization structures may have a different etch rate for device features having at least one lateral dimension that significantly differs from a respective lateral dimension of the via openings under consideration. In these etch recipes, the material removal rate in the opening having the increased lateral dimension may be higher, thereby removing material from a corresponding etch stop layer, and even etch through the etch stop layer, while the etch process may reliably stop in the etch stop layer in the via openings of critical dimensions. By providing an appropriately configured conductive region below the one or more test openings, a variation of the respective electrical characteristics may be determined, which may indicate the overall process conditions during the respective anisotropic etch process. Consequently, the respective electrical characteristics may be used to monitor and, in some aspects, to control one or more of the respective etch phases involved in forming respective via openings.

In one illustrative method disclosed herein, a via opening is formed in a dielectric layer that is formed on an etch stop layer located above a first region and a second region of a semiconductor device, wherein the via opening is formed according to a first etch process. The method further comprises forming a test opening commonly with the via opening in the dielectric layer according to the first etch process, wherein the test opening has at least one lateral dimension that is greater than a lateral dimension of the via opening. Furthermore, electric measurement data is obtained from a metal region located below the test opening and at least one characteristic of the first etch process is estimated on the basis of the electric measurement data.

In a further illustrative method disclosed herein, a first etch process is performed in order to form a via opening having a first lateral dimension and forming a first test opening having a second lateral dimension that is greater than the first lateral dimension. The via opening and the first test opening are formed in a dielectric layer stack of a semiconductor device, wherein the dielectric layer stack comprises an etch stop layer. The first etch process is controlled to stop prior to etching through the etch stop layer in the via opening. Furthermore, the method comprises determining at least one first electric property of a metal region formed below the first test opening.

In a further illustrative embodiment, a semiconductor structure comprises a first metallization layer located above a first region and a second region of a substrate. A metal line is formed in the first metallization layer above the first region, and a test metal region is formed in the first metallization layer above the second region. Moreover, a second metallization layer is formed above the first metallization layer and a via is formed in the second metallization layer, wherein the via has a first lateral dimension and extends into the metal line. The semiconductor device further comprises a conductive test feature formed in the second metallization layer and extending into the test metal region, wherein the conductive test feature has a second lateral dimension that is greater than the first lateral dimension. Additionally, a probe pad is formed in the first metallization layer and is configured to enable access by an external electric probe at an intermediate manufacturing stage, wherein the probe pad is electrically connected to the test metal region.

In another related embodiment, the semiconductor structure comprises at least one further conductive test feature formed in the second metallization layer above the second region, wherein the at least one further conductive test feature is electrically connected to the probe pad and has a third lateral dimension that is different from the first and second lateral dimensions.

BRIEF DESCRIPTION OF THE DRAWINGS

The disclosure may be understood by reference to the following description taken in conjunction with the accompanying drawings, in which like reference numerals identify like elements, and in which:

FIG. 2b schematically illustrates a cross-sectional view of the device of FIG. 2a;

FIGS. 3b-3c schematically illustrate respective cross-sectional views of the test structure of FIG. 3a;

Figure 1:
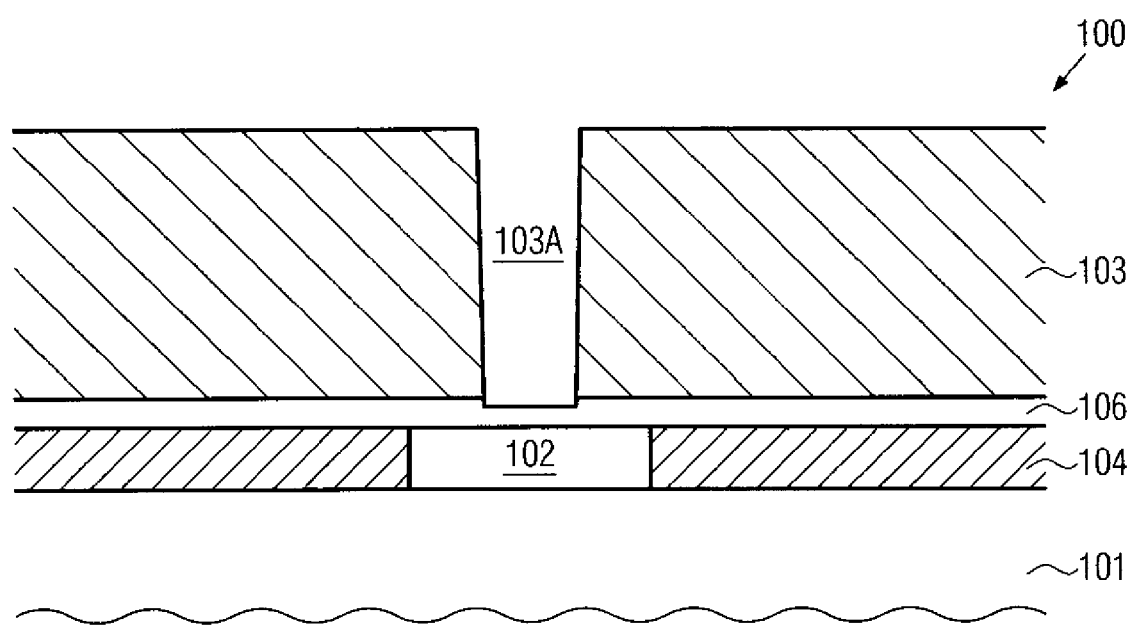
FIG. 1 schematically illustrates a cross-sectional view of a semiconductor device in a manufacturing stage for forming a via opening in a dielectric layer stack according to conventional strategies.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the aspects disclosed herein provide a technique that enables the assessment of one or more characteristics of an etch process, for instance variations of process conditions, during the formation of via openings formed in a metallization structure of advanced semiconductor devices. Contrary to conventional process monitoring techniques, the embodiments disclosed herein contemplate the formation of appropriately dimensioned test openings formed in accordance with a respective etch process to be evaluated, wherein the influence of the one or more test openings on the electrical characteristics of an appropriately designed lower lying metal region are determined. In this way, the etch process for forming the actual via openings may be estimated on the basis of a variation of electrical characteristics of the respective test metal region, into which the test openings may be etched according to the specific etch process, thereby enabling a quantitative estimation of the etch depth or recess within the respective test metal region. In some aspects, therefore, the etch behavior of a respective etch stop layer may be monitored and evaluated prior to actually etching through the etch stop layer in the actual via openings, since the test openings may be provided with increased lateral dimensions compared to the actual via openings, thereby producing a locally increased etch rate which may result in an open etch stop layer in the test structure.

For example, it has been recognized that respective anisotropic etch recipes typically used for forming the via openings may result in an increased etch rate at openings having increased lateral dimensions so that this effect may be advantageously used to modify the respective electrical characteristics of one or more metal regions located below the respective one or more test openings. For instance, it has been observed that so-called die seals, i.e., trenches surrounding a die area, which may also be provided in respective via layers of metallization structures, may result in a higher etch rate compared to the actual via openings in respective anisotropic etch processes of interest. Consequently, by appropriately selecting the respective lateral dimensions of the test openings, it may be ensured that at least one test opening, if for instance a plurality of test openings are provided, exhibits an efficiently high etch rate so as to etch into the underlying test metal region, irrespective of whether the presently prevailing etch conditions may have actually resulted in completely removing the etch stop layer within actual via openings. Moreover, the lateral dimensions of the one or more test openings may be selected such that a reliable etching through the etch stop layer for at least some of the openings may be obtained, even if the etch process may have been stopped in the etch stop layer in the respective via openings, thereby providing the potential for individually evaluating the corresponding etch rate or the corresponding etch conditions during the main etch step through the dielectric material, thereby allowing precise monitoring and, in some aspects, controlling the corresponding etch process so as to obtain a well-defined material removal of the etch stop layer, which may then be opened in a separate etch step on the basis of well-defined start conditions.

Since corresponding electric measurement data may be obtained in a time-efficient manner with high statistical significance, one or more processes may be monitored and, in some illustrative embodiments, controlled on the basis of electrical measurement data. Consequently, specifically prepared test wafers, which may usually be provided with thick etch stop layers for estimating the respective etch rate, may no longer be necessary, or the number thereof may at least be significantly reduced while also relaxing the requirements for SEM (scanning electron microscope) resources, which may thus be advantageously used for other measurement activities.

Figure 2A:
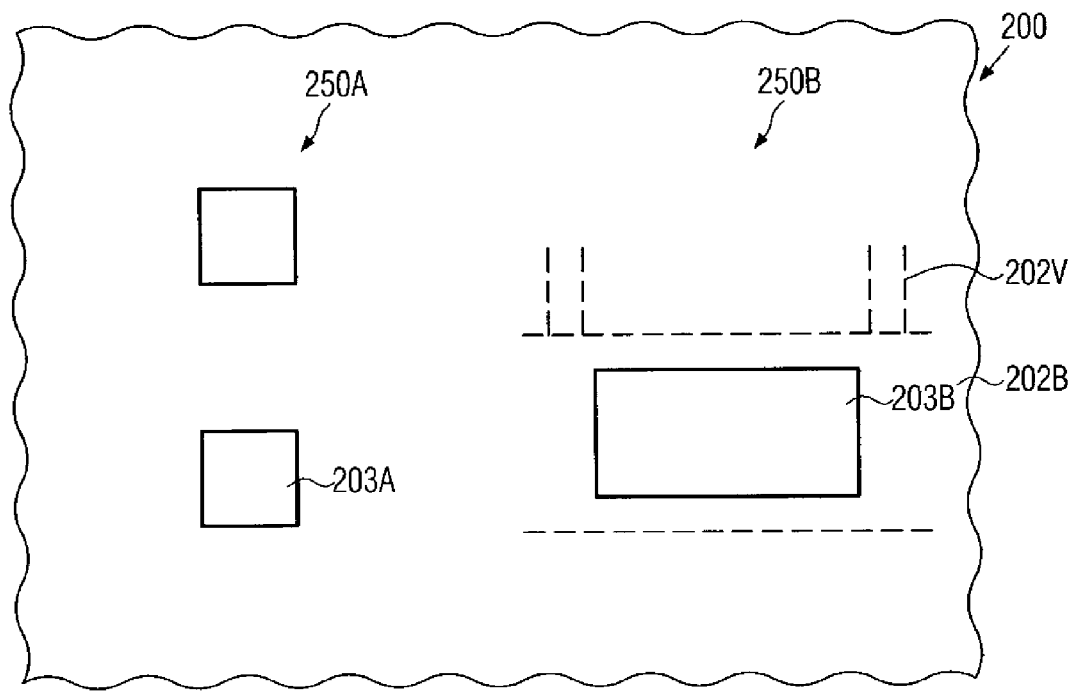
FIG. 2a schematically illustrates a top view of a semiconductor device comprising a test structure for estimating etch conditions during the formation of via openings in a metallization structure according to illustrative embodiments.

FIG. 2a schematically illustrates a top view of a semiconductor device 200 comprising a first region 250A and, at least in this manufacturing stage, a second region 250B, wherein the second region 250B may comprise an appropriate test structure for estimating an etch process used to form via openings 203A within the first region 250A according to a specified etch recipe. The test structure in the region 250B may comprise at least one test opening 203B having at least one lateral dimension that is greater than a corresponding lateral dimension of the respective via opening 203A. For example, the at least one test opening 203B may be provided in the form of a trench-like feature, wherein at least a length dimension may be significantly larger compared to the respective dimensions of the via openings 203A. Furthermore, the test structure in the region 250B may comprise one or more test metal regions 202B, indicated by dashed lines, since the test metal region 202B is provided in a lower lying metallization layer, as will be described in more detail with FIG. 2b. In some illustrative embodiments, the test metal region 202B may comprise appropriate connections to respective probe pads (not shown) and may, additionally, comprise respective voltage tabs 202V, which may also be connected to respective probe pads (not shown), if different conductive paths for forcing a current into the test metal region 202B and obtaining a voltage across a portion of the region 202B may be required.

Figure 2B:
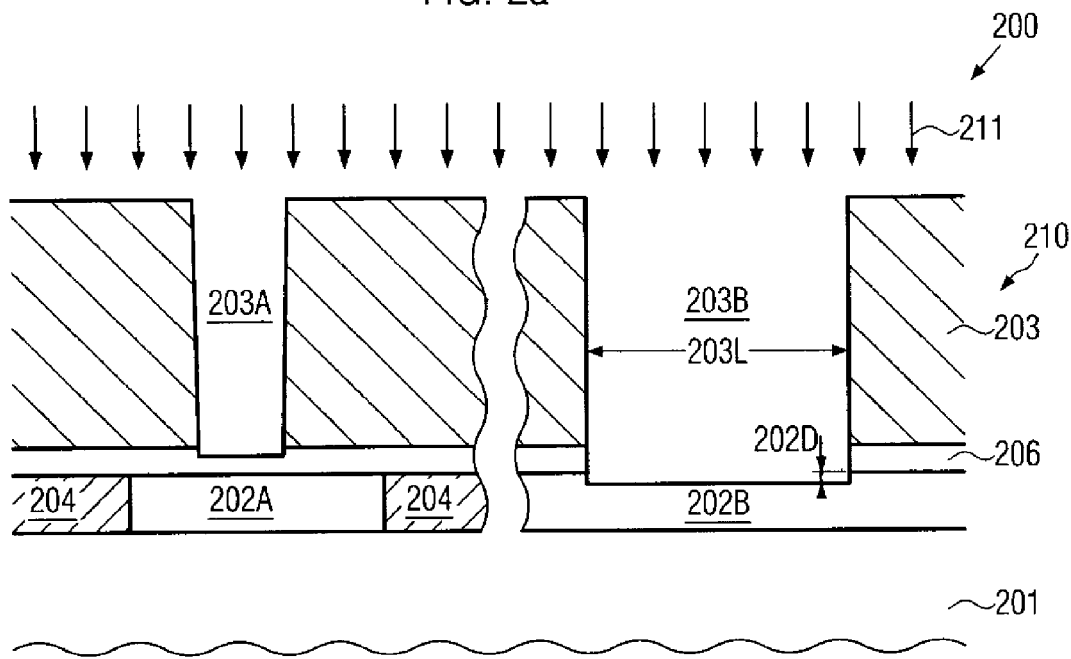

FIG. 2b schematically illustrates a cross-sectional view of the semiconductor device 200 of FIG. 2a. The device 200 may comprise a substrate 201, which may comprise any appropriate material layers for forming respective circuit elements therein, such as transistors, capacitors and the like. Respective circuit elements may be formed in the first region 250A, which may represent a respective die area in which an integrated circuit is provided. Depending on the position of the second region 250B within the semiconductor device 200, respective product circuit elements may also be formed in the substrate 201 in the second region 250B, while, in other cases, the second region 250B may be positioned in a device area which may be destroyed during the separation of individual dies of the semiconductor device 200. Furthermore, in some illustrative embodiments, respective circuit elements, such as resistors, transistors and the like, may also be formed in the second region 250B, as will be described later on, in order to provide a respective circuitry for enhancing flexibility and/or accuracy for obtaining appropriate electrical measurement data on the basis of the one or more test metal regions 202B. Furthermore, the substrate 201 may have formed thereon a dielectric layer 204, which may be comprised of any appropriate material, such as "conventional" dielectrics in the form of silicon dioxide, silicon nitride, silicon oxynitride and the like, and/or sophisticated low-k dielectric materials, which are to be understood as materials having a low permittivity in the range of 3.0 and less. Furthermore, respective metal regions, for instance in the form of a metal line 202A, may be provided in the first region 250A to which an electrical connection has to be formed on the basis of the via openings 203A in a later manufacturing stage. Similarly, the test metal region 202B may be provided in this manufacturing stage, wherein a certain portion of the material as originally provided may be removed, since the test opening 203B may extend into the test metal region 202B according to a specified penetration depth 202D.

The dielectric layer 204, in combination with the respective metal regions 202A, 202B, may represent a metallization layer of the semiconductor device 200 above which at least one further metallization layer is to be formed. Hence, the semiconductor device 200 may comprise a dielectric layer stack 210, which may include a first dielectric layer 203 and a second dielectric layer 206, which may be provided to act as an etch stop layer during a corresponding etch sequence for forming the respective via openings 203A in the first region 250A. The first dielectric layer 203 may be comprised of any appropriate material and may also comprise a plurality of sub-layers, if required, in order to meet the device requirements. For instance, in highly sophisticated applications, the dielectric layer 203 may comprise a low-k dielectric material in order to reduce parasitic capacitances in the respective metallization layer. Similarly, the etch stop layer 206 may be comprised of any appropriate material composition and may also comprise two or more sub-layers, depending on the device and process requirements. For instance, the etch stop layer 206 may be formed as a cap layer for the respective metal regions 202A and also the metal region 202B, which may comprise a high content of copper that is well-known to diffuse in a plurality of dielectric materials, such as silicon dioxide, low-k dielectric materials and the like. Consequently, the etch stop layer 206 may be selected with respect to its material composition such that a reliable confinement of the copper material may be accomplished, while also the penetration of reactive components, such as fluorine, oxygen and the like, may be significantly reduced to substantially avoid any undue reaction with the copper material. At the same time, the respective interface formed between the respective metal material and the etch stop layer 206 has to provide sufficient strength in order to reduce any diffusion paths, which may be a main cause for enhanced electromigration effects in the metal regions 202A during operation of the semiconductor device 200. In addition, the material composition of the etch stop layer 206 may also provide the desired etch stop capabilities in order to reduce process non-uniformities of a corresponding anisotropic etch process for forming the via openings 203A so that, at a final phase, moderately uniform start conditions are provided for finally opening the etch stop layer 206 in order to connect to the respective metal regions 202A in a highly uniform manner.

As previously explained, in sophisticated applications, the overall permittivity of the dielectric layer stack 210 may have a significant influence on the operational behavior of the semiconductor device 200, as typically the signal propagation delay of the device is substantially determined by the corresponding parasitic resistances and capacitances caused by the wiring structure of the device 200. Due to the requirement posed on the etch stop layer 206, as described above, moderately dense materials of specific configuration have to be provided, which typically exhibit a significantly higher relative permittivity compared to the dielectric layer 203, wherein the increased permittivity of the etch stop layer 206 may therefore reduce the performance of the overall metallization layer. Consequently, the etch stop layer 206 may be provided on the basis of one or more material compositions with a reduced thickness so as to maintain the overall increase in permittivity at a lower level, while on the other hand sufficient mechanical strength and etch stop capabilities have nevertheless to be provided. With decreasing feature sizes, there is also a general drive to reduce the thickness of the etch stop layer 206 in order to minimize any negative impact on the overall performance of the device 200. Thus, a thickness of several nanometers to several tenths of nanometers may be used, depending on the specific device requirements.

The semiconductor device 200 as shown in FIGS. 2a and 2b may be formed on the basis of the following processes. Respective circuit elements may be formed in and above the substrate 201 using well-established process techniques wherein, in some illustrative embodiments, respective circuit elements may also be provided in the second region 250B in order to provide enhanced functionality of the respective test structure, as will be described later on. For instance, if respective resistors, transistors and the like may be required, the corresponding circuit elements may be formed commonly with respect to circuit elements in the first region 250A. Thereafter, the dielectric layer 204 may be formed on the basis of any appropriate deposition techniques, as are also described with reference to the device 100. Next, the metal region 202A and the test metal region 202B may be formed by patterning the dielectric layer 204 and filling the respective openings with an appropriate material, such as copper-based metals and the like, wherein well-established process techniques may be used. The test metal region 202B may be formed on the basis of an appropriately modified patterning scheme in order to obtain desired lateral dimensions in the one or more test metal regions 202B. For instance, in some illustrative embodiments, the test metal region 202B may represent a "small" portion of a metal area configuration including respective connections to a probe pad (not shown) in order to establish the highest resistance of a corresponding conductive path in the small portion, wherein the respective lateral dimensions of this small portion may correspond to the lateral dimensions of the test opening 203B, thereby providing a high degree of resistance modulation, depending on the respective penetration depth 202D. In other illustrative embodiments, the respective voltage tabs 202V may be provided so that the conductive behavior of the metal region 202B may be substantially determined for the area between the voltage tab 202V while other influences on the overall resistance of the respective conductive path, of which the test metal region 202B is a part, may not be relevant.

Thereafter, the etch stop layer 206 may be formed on the basis of respective process and device requirements, as previously explained, followed by the deposition of the dielectric layer 203 in accordance with well-established process techniques. Thereafter, a respective lithography process may be performed in order to define respective etch masks for forming the via openings 203A and the test opening 203B. As previously explained, the respective lateral dimensions, for instance the dimension 203L may be greater so as to obtain a corresponding increased etch rate during the subsequent anisotropic etch process. For example, the lateral dimension 203L may be provided with several hundred nanometers and more, thereby resulting in a corresponding increased etch rate which may provide the penetration depth 202D even though a corresponding etch front may reliably stop in the via opening 203A. Thereafter, an etch process 211 may be performed on the basis of well-established process recipes in which, in a first etch process, an anisotropic step is performed to etch through the dielectric layer 203, resulting in the via opening 203A and, due to the increased etch rate in the test opening 203B, the opening extends into the metal region 202B. Thus, in some illustrative embodiments, the etch sequence 211 may be estimated for this phase on the basis of the respective penetration depth 202D, which in turn may significantly influence the resistance of the metal region 202B, as previously explained.

Thus, in some illustrative embodiments, the etch sequence 211 may be estimated, for instance, in view of stability of process conditions during the processing of a plurality of substrates by determining the respective electrical conductivity of the metal region 202B on a regular basis. For instance, a respective measurement of the resistance of the region 202B may be accomplished by accessing respective probe pads by an external electric probe of well-established electrical measurement apparatus, wherein the respective probe pads may also be reliably exposed during the etch process 211 due to the significantly increased dimensions compared to the test opening 203B. In other cases, additional probe pads may be provided for the voltage tabs 202V, thereby eliminating any influences of respective connections by forcing a current through the metal region 202B while determining the voltage drop across the voltage tabs 202V. Consequently, for this first etch step of the sequence 211, reliable measurement data may be obtained on the basis of in-line measurement techniques, thereby providing a high degree of statistical relevance while avoiding undue delay of the measurement data.

In other illustrative embodiments, the process sequence 211 may be performed as a substantially in situ process, in which, in a second etch step, the etch stop layer 206 may be opened in the via openings 203A on the basis of an appropriately designed etch chemistry and etch time so as to obtain a well-defined penetration into the respective metal regions 202A. As previously explained, the thickness of the etch stop layer 206 may be selected in view of performance characteristics, i.e., in view of a low overall permittivity, thereby requiring high control of the etch process 211 and in particular during the opening of the etch stop layer 206, since a significant variation of the corresponding etch rate may then result in a correspondingly increased penetration depth, depending on the present etch rate of the etch stop layer 206. Thus, in this case, the exposed portion of the metal region 202B may then be further subjected to material erosion, the degree of which may then be indicative of the respective etch rate in the layer 206, which may then be identified on the basis of the respective variation in electric conductivity of the region 202B, as also previously described.

In some illustrative embodiments, the first etch step 211 may be performed as previously described, and the etch sequence may be interrupted in order to determine the respective electric conductivity of the metal region 202B as described above. Thereafter, the etch process 211 may be continued with the second etch step for opening the etch stop layer 206 in the via opening 203A, resulting in an additional material removal in the test metal region 202B. Thus, by estimating the corresponding difference in electric resistivity, the second etch step may be evaluated with a high degree of decoupling from the respective first etch step. Consequently, with respect to overall process uniformity, the entire sequence 211, as well as individual parts thereof, i.e., a first etch step for etching through the dielectric layer 203 and the second etch step for opening the etch stop layer 206 in the via openings 203A, may be evaluated on the basis of electrical measurement data, which may also be used, due to the high statistical relevance thereof, for controlling one or more phases of the etch process 211.

With reference to FIGS. 3a-3f, further illustrative embodiments will now be described in more detail, in which a plurality of test openings may be provided with differing lateral sizes in order to provide a "digital" response to etch-related characteristics to provide a measurement procedure of increased stability.

Figure 3A:
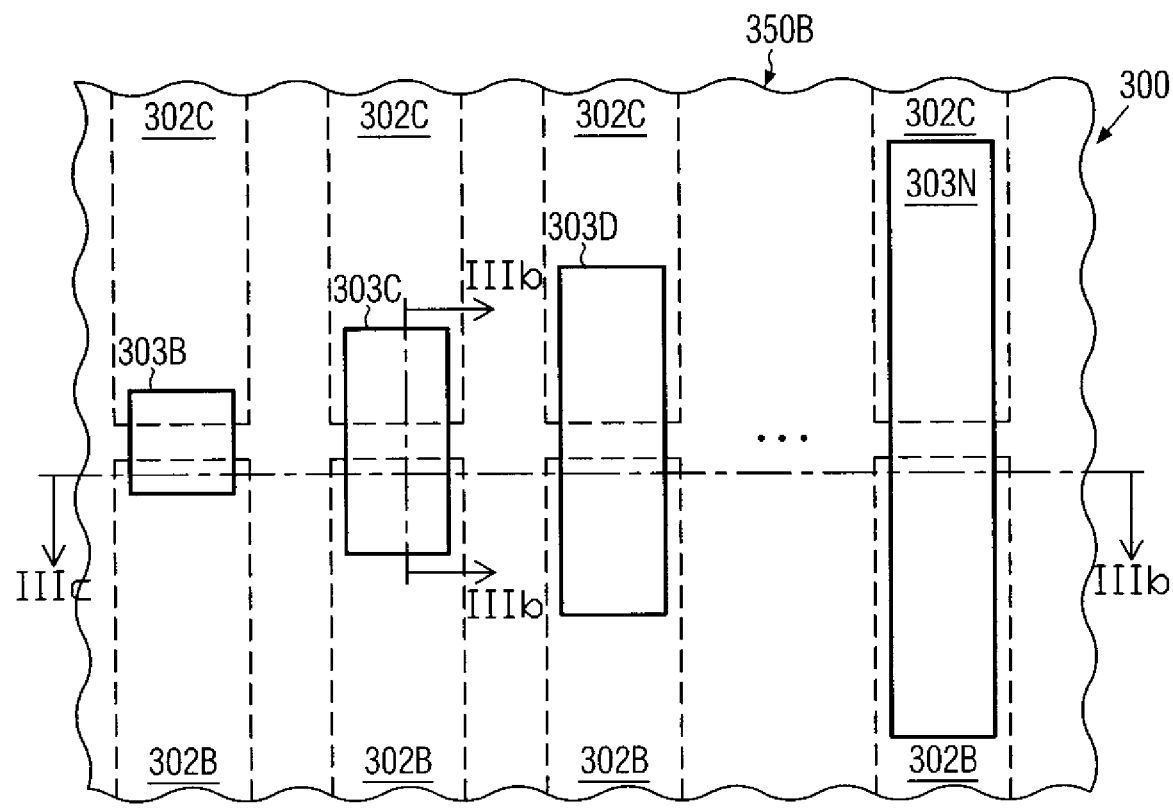
FIG. 3a schematically illustrates a top view of a test structure for determining etch-related characteristics on the basis of a plurality of test openings according to further illustrative embodiments.

FIG. 3a schematically illustrates a top view of a region 350B of a semiconductor device 300. The region 350B may comprise a plurality of test openings 303B, 303C, 303D, 303N, at least some of which may have at least one different lateral dimension. For instance, as shown, the width of the corresponding openings may be substantially the same, while a length thereof may vary so as to obtain different etch rates therein. For instance, the respective lateral dimensions of the test opening 303B may be significantly less compared to respective lateral dimensions of the test opening 203B as shown in FIGS. 2a and 2b so as to establish a respective range of effective etch rates by the gradually increasing test openings 303C, 303D, 303N. In some illustrative embodiments (not shown), one or more of the test openings 303B, 303C, 303D, 303N may be formed above respective test metal regions, such as the region 202B of FIG. 2b, which may then be individually evaluated with respect to the respective electrical conductivity in order to provide a more detailed estimation with respect to the corresponding etch rates. For example, in case the corresponding variation of the etch rate may not linearly vary with the lateral size of the respective test openings, a corresponding provision of a plurality of test opening sizes, some of which may be very similar to the size of actual via openings, may allow for determining the actual etch rate in respective via openings in a digital manner.

In some cases, a respective number of probe pads, which may have a significant size of several tenths of micrometers in each lateral dimension, may be considered inappropriate while nevertheless a robust and more detailed information of the etch rate may be desirable. In the embodiment shown in FIG. 3a, the corresponding region 350B may comprise a respective test structure that enables the determination of the desired information on the characteristics of the etch process on the basis of a plurality of differently sized test openings while only requiring a low number of probe pads, such as two probe pads.

In the embodiment shown, a plurality of test metal regions 302B may be provided in a corresponding lower lying metallization level, wherein the regions 302B may be positioned so as to be overlapped by a portion of the respective test openings 303B, 303C, 303D, 303N. In some illustrative embodiments, the regions 302B may be provided as a single continuous metal region. Furthermore, respective metal regions 302C may be provided, which may represent individual metal regions positioned such that a portion thereof is overlapped by the respective test openings 303B, 303C, 303D, 303N, while a gap filled with dielectric material is formed between the metal regions 302B and 302C.

With respect to a manufacturing process for forming the semiconductor device 300, the same criteria apply as previously explained with reference to the device 200, except for the modification of the respective patterning sequences, that is, for defining the respective regions 302B, 302C in the lower lying metallization level and for defining the respective etch masks for the openings 303B, 303C, 303D, 303N of varying lateral size.

Figure 3B:
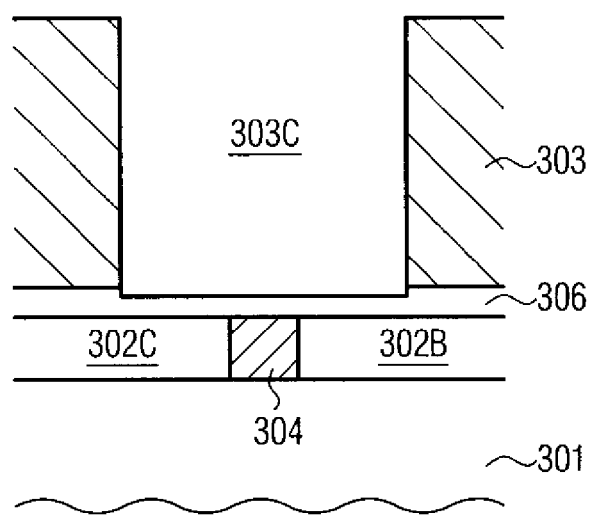

FIG. 3b schematically illustrate a cross-sectional view taken along the line IIIb of FIG. 3a. Hence, the device 300 comprises the substrate 301 having formed thereon the dielectric layer 304, in which are embedded the test metal regions 302C, 302B. Furthermore, the etch stop layer 306 may be formed above the dielectric layer 304 and the metal region 302C, 302B followed by the dielectric layer 303. In the manufacturing stage, a first anisotropic etch process may have been performed, as previously described with reference to the etch process 211, resulting in a significant removal of material of the etch stop layer 306, while, however, not completely etching through the layer 306. For example, the lateral dimensions of the opening 303C may be selected to be significantly less compared to the opening 203B of FIG. 2b so as to provide a corresponding range of possible digital measurement values, as will be explained later on. Thus, the corresponding removal rate in the opening 303B may be even less and may be comparable to a respective removal rate in actual via openings, if the opening 303B has comparable lateral dimensions. Similarly, one of the openings 303D, 303N may represent a first test opening, in which the respective etch stop layer 306 is substantially completely removed, as will be described with reference to FIG. 3c.

Figure 3C:
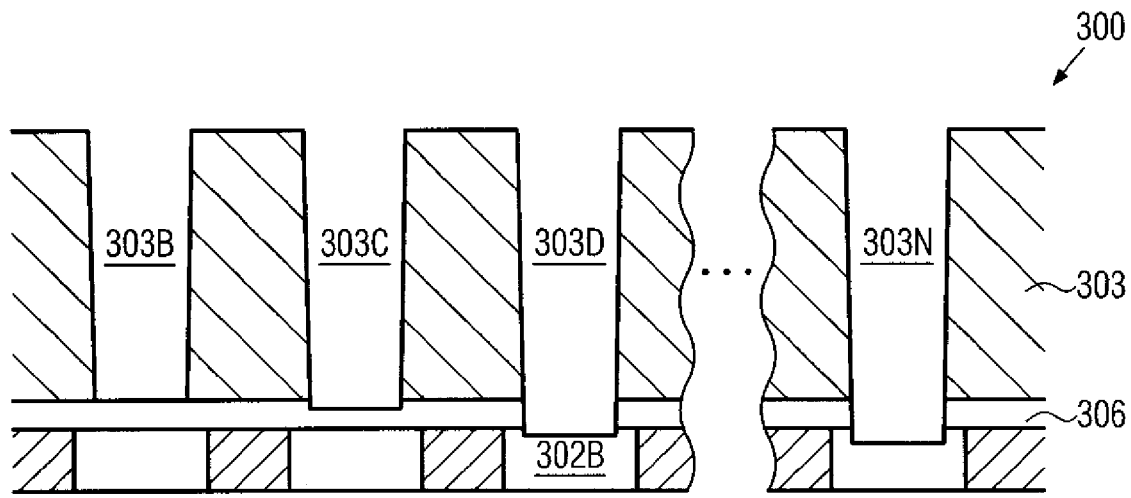

FIG. 3c illustrates a cross-sectional view along the section IIIc of FIG. 3a. As is evident, the opening 303D may represent the first opening in which the etch stop layer 306 is substantially completely removed so that the corresponding opening 303D may extend down to the respective metal regions 302B, 302C.

Consequently, a respective process condition during the corresponding first phase may be "encoded" into the respective openings 303B, 303C, 303D, 303N. During a corresponding measurement procedure for determining the respective electrical characteristics of the openings 303B, 303C, 303D, 303N, an appropriate conductive sacrificial material may be provided to at least partially fill the respective test openings 303B, 303C, 303D, 303N.

Figure 3D:
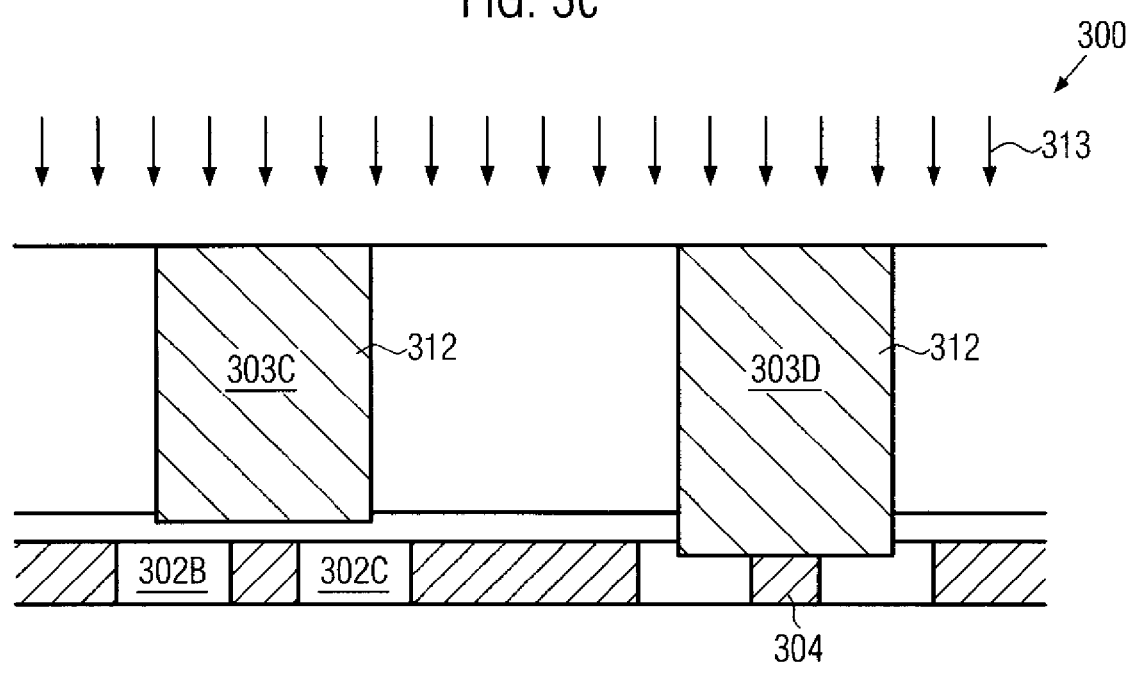
FIG. 3d schematically illustrates the test structure of FIG. 3a when an appropriate sacrificial electric material is provided in the respective test openings according to illustrative embodiments.

FIG. 3d schematically illustrates a cross-sectional view of the semiconductor device 300, for instance, illustrating the openings 303C and 303D having formed therein a sacrificial conductive material 312. For example, the sacrificial material 312 may be deposited on the basis of any appropriate process 313, which may, for instance, be a spin-coating process, in which an appropriate carrier material may be provided including a respective conductive substance, which may then be applied in a highly non-conformal manner. For instance, a plurality of polymer materials including respective substances for increasing the electric conductivity may be used for this purpose. During the process 313, a respective residual layer may also be formed on exposed portions of the dielectric layer 303, which may be removed during the application, when, for instance, a spin-coating process is used, or other appropriate mild cleaning processes may be performed. In this case, the removal of the excess material of the material 312 is less critical as long as the openings 303B, 303C, 303D, 303N remain at least partially filled. Also, respective openings connecting to corresponding probe pads located in the lower metallization level may be filled. Consequently, during the respective process 313, the substance 312 may also be provided to connect to the respective probe pads, thereby significantly facilitating the respective measurement procedure, during which respective measurement probes have to be electrically connected to the respective probe pads.

Consequently, due to the different removal rates and thus exposure of the metal regions 302B, 302C, these regions may be electrically connected to each other, for instance as shown for the region 303D, which may be reliably detected by an appropriate measurement process, wherein corresponding etch conditions may be identified on the basis of the digital information, i.e., the number of the first test opening providing electrical contact between the respective test metal regions 302B, 302C. Thus, increased robustness may be obtained in view of any measurement non-uniformities.

Figure 3E:
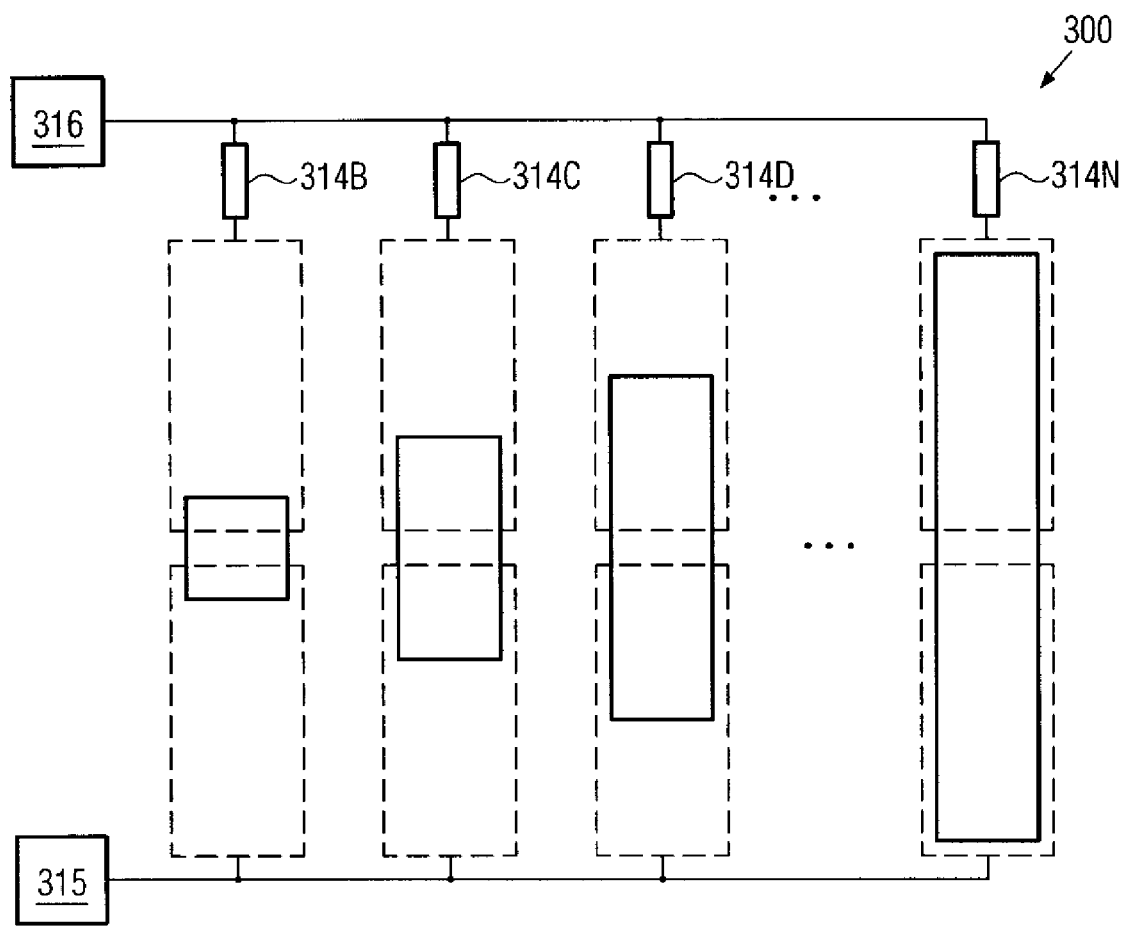
FIG. 3e schematically illustrates a top view of a test structure including appropriately selected resistors for obtaining "digital" information with respect to etch-related characteristics according to further illustrative embodiments.

FIG. 3e schematically illustrates the device 300 according to one illustrative embodiment, in which the region 350B of the device 300 as shown in FIG. 3a may be combined with additional circuit elements, such as resistors 314B, 314C, 314D, 314N, which may be represented by any appropriate circuit elements having the desired conductivity behavior. For instance, the resistors 314B, 314C, 314D, 314N may be formed in accordance with device requirements together with respective resistors in other device areas of the device 300, for instance on the basis of implanted semiconductor regions and the like. It should be appreciated that, for convenience, the resistors 314B, 314C, 314D, 314N are illustrated as circuit symbols without their actual configuration. That is, the resistors 314B, 314C, 314D, 314N may be formed in a device level of the device 300 and may have respective contact areas and connections within the lower lying device level and metallization level to connect to the respective metal regions 303C, as schematically illustrated in FIG. 3e. Similarly, respective probe pads 315, 316 are illustrated in a highly schematic manner in order to not unduly obscure the configuration of the device 300. That is, the probe pads 315, 316 may be formed in the same metallization level as the respective metal regions 302B, 302C as previously explained, and may have the appropriate dimension for access by an external measurement probe. Furthermore, it should be appreciated that during the formation of the respective test openings 302B, 302C, 302D, 302N, respective openings may also be formed to connect to the probe pads 315, 316, which may be reliably exposed after the first phase of the corresponding etch process due to the significantly larger lateral dimensions of the probe pads 315, 316 compared to the test openings 302B, 302C, 302C, 302N.

After the corresponding filling in of the sacrificial conductive material 312 as previously described, and removing the material, in some embodiments at least around the corresponding probe pads 315, 316, or by completely removing excess material of the sacrificial material 312, the overall resistance of the region 350B may be determined on the basis of the pads 315, 316 which may be contacted via the respective sacrificial material 312. Hence, the overall resistance is substantially determined by test openings 314D, 314n, when the opening 314D is the first test opening to provide contact to the underlying metal regions 302B, 302C, as is, for instance, shown in FIG. 3d. For example, the respective resistance values of the resistors 314B, 314C, 314D, 314N may be selected moderately high compared to any resistance of the respective conductive paths defined by the respective metal regions 302B, 302C and the substance 312 so that a well detectable change in resistance may be detected, thereby reliably enabling the detection of the number of test openings providing a short circuit between the respective underlying metal regions 302B, 302C.

Consequently, upon a variation of the respective etch rate during the first phase of the corresponding etch process, a different one of the respective test openings may be the first to provide a respective short circuit, thereby obtaining a reliably identifiable resistance value, which may then be used as an indication of the respective etch conditions while substantially avoiding or at least significantly reducing measurement-induced inaccuracies. Moreover, the information may be extracted on the basis of the pads 315, 316, thereby reducing the area required for the test structure 350B.

After the measurement procedure, the substance 312 may be removed, for instance, on the basis of well-established cleaning or etch processes and the corresponding etch process of interest may be continued so as to finally open corresponding via openings in the device areas of the device 300. It should be appreciated that the measurement technique performed on the basis of the region 350B may be readily combined with one or more regions 250B, as previously described, in order to provide a monitoring procedure for estimating the etch conditions when etching through the etch stop layer 306. For instance, an appropriately sized test opening may be provided along with the openings 314B, 314C, 314D, 314N and may be connected to an additional probe pad so that the corresponding resistance change may be determined after the final etch process, as previously explained.

Figure 4A:
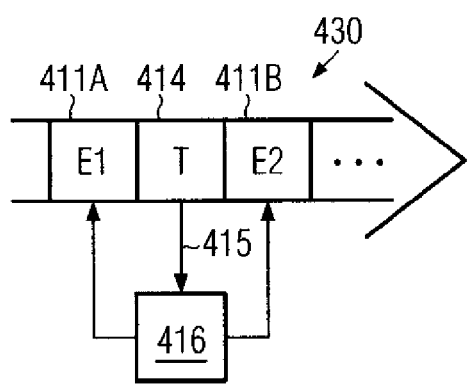
FIGS. 4a-4b schematically illustrate respective control strategies applied during the formation of via openings on the basis of electric measurement data according to further illustrative embodiments.
Figure 4B:
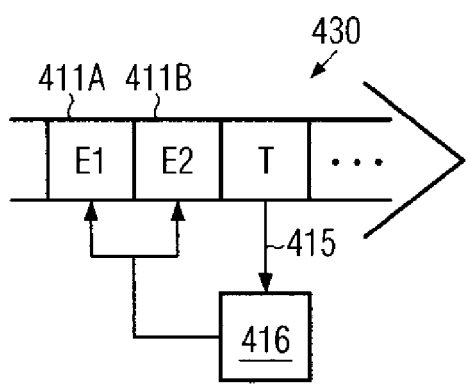

With reference to FIGS. 4a and 4b, respective control strategies may be described in which the electrical measurement data obtained with high statistical relevance may be used to control the respective etch process previously described.

FIG. 4a schematically illustrates a process flow 430 including an etch sequence E1, E2 as required for the formation of respective via openings, as previously described. Hence, the process flow 430 may comprise a first etch step 411A (E1) to etch the corresponding dielectric material, such as the layer 203 or 303, as previously described. Furthermore, a measurement process (T) 414 may be performed after the etch process 411A to obtain respective electric measurement data, as previously described. The respective measurement data, indicated as 415, may be provided to a control unit 416 that has implemented therein an appropriately designed control strategy to provide at least one updated value of a manipulated variable of a second etch process (E2) 411B that is designed to etch through the etch stop layer, such as the layer 206, 306, as previously described. Hence, in this case, an increased process uniformity may be obtained, since at least process variations of the first etch step 411A may be taken into consideration when preparing the etch ambient for the second etch step 411B. Typically, the etch rate of the steps 411A, 411B may be correlated, or at least respective changes may be correlated, when the corresponding processes 411A, 411B are performed in the same etch tool. Thus, from respective measurement data from the step 411A, appropriate newly adjusted target values of the manipulated variables of the process 411B may be obtained in a predictive manner, for instance on the basis of respective advanced process control strategies. In further illustrative embodiments, the control unit 416 may be further configured to adjust at least one process parameter for the process 411A on the basis of the electrical measurement data 415.

FIG. 4b schematically illustrates the process flow 430 according to another illustrative control strategy in which the processes 411A, 411B may be performed without interruption, as previously explained, wherein the measurement procedure 414 may be performed after opening the respective via openings and prior to further processes, such as the deposition of a barrier material and the like. In this case, the electrical measurement data 415 may be used to control the entire process sequence 411A, 411B, wherein, in some illustrative embodiments, a certain type of weighting of these processes may be performed by the controller 416 since, for instance, the significant fraction of change in conductivity of the respective test structure may be caused by a varying etch rate of the etch stop layer, as previously described with respect to FIGS. 2a and 2b.

As a result, the subject matter disclosed herein provides techniques and test structures that are suitable for estimating the characteristics of an etch process for forming via openings in sophisticated metallization structures on the basis of statistically relevant measurement data, which may be obtained by in-line metrology tools with low delay. Consequently, the process stability of respective etch tools may be monitored and/or controlled while avoiding or at least significantly reducing the utilization of sophisticated analysis techniques, requiring electron microscopy tools and the like.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A semiconductor structure, comprising:
   a first metallization layer located above a first region and a second region of a substrate;
   a metal line formed in said first metallization layer above said first region;
   a test metal region formed in said first metallization layer above said second region;
   a second metallization layer formed above said first metallization layer;
   a via formed in said second metallization layer, said via having a first lateral dimension and extending into said metal line;
   a conductive test feature formed in said second metallization layer and extending into said test metal region, said conductive test feature having a second lateral dimension that is greater than said first lateral dimension; and
   a probe pad formed in said first metallization layer and configured to enable access by an external electric probe at an intermediate manufacturing stage, said probe pad electrically connected to said test metal region.

2. The semiconductor structure of claim 1, wherein said second metallization layer comprises an etch stop layer.

3. The semiconductor structure of claim 2, wherein a thickness of the etch stop layer lies in the range of several nanometers to several tenths of nanometers.

4. The semiconductor structure of claim 1, further comprising voltage tabs, which are connected to the respective probe pads for different conductive paths for forcing a current into the test metal region.

5. The semiconductor structure of claim 1, wherein the conductive test feature extends into the test metal region according to a specified penetration depth.

6. The semiconductor structure of claim 1, wherein the at least one conductive test feature is provided in the form of a trench-like feature, wherein at least a length dimension is significantly larger compared to the respective dimensions of the via opening.

7. The semiconductor structure of claim 1, wherein the probe pads have a size of several tenths of micrometers in each lateral dimension.

8. The semiconductor structure of claim 1, wherein said conductive test feature is at least partially filled with a conductive substance.

9. The semiconductor structure of claim 1 or 2, wherein said circuit elements are resistors.

10. A semiconductor structure comprising
    a plurality of test metal regions provided in a lower lying metallization level;
    a via opening having a first lateral dimension in a dielectric layer stack of said semiconductor structure;
    a first test opening having a second lateral dimension greater than said first lateral dimension in said dielectric layer stack of said semiconductor structure;
    a probe pad formed in said lower lying metallization level and configured to enable access by an external electric probe at an intermediate manufacturing stage, said probe pad electrically connected to said plurality of test metal regions; and
    a second conductive test feature formed in said dielectric layer stack of said semiconductor structure, said second conductive test feature electrically connected to said probe pad and having a third lateral dimension other than said first and second lateral dimensions.

11. The semiconductor structure of claim 10, wherein said first lateral dimension is approximately 100 nm or less.

12. The semiconductor structure of claim 10, wherein the length of the first and second conductive test feature is variable in correspondence with different etch rates.

13. The semiconductor structure of claim 10, wherein the plurality of test metal regions provided in said corresponding lower lying metallization level are positioned so as to be overlapped by a portion of the respective plurality of conductive test features.

14. The semiconductor structure of claim 10, wherein a plurality of test metal regions is provided as a single continuous metal region.

15. The semiconductor structure of claim 10, wherein said dielectric layer stack comprises an etch stop layer.

16. The semiconductor structure of claim 15, wherein one of the first or second conductive test feature represents a test opening in which the respective etch stop layer is substantially completely removed such that said test opening extends down to the respective metal regions.

17. The semiconductor structure of claim 10, wherein said first and second conductive test feature is at least partially filled with a conductive substance.

18. A semiconductor structure comprising:
- a first metallization layer located above a first region and a second region of a substrate;
- a metal line formed in said first metallization layer above said first region;
- a test metal region formed in said first metallization layer above said second region;
- a second metallization layer formed above said first metallization layer;
- a via opening having a first lateral dimension in said second metallization layer;
- a first test opening having a second lateral dimension greater than said first lateral dimension in said second metallization layer;
- circuit elements in the first and in the second region of the substrate, in order to provide a circuitry for obtaining appropriate electrical measurement data on the basis of the one or more test metal regions.

19. The semiconductor structure of claim 18, wherein the resistors have respective contact areas and connections to connect to the respective metal regions.

* * * * *